(12) United States Patent
Herold et al.

(10) Patent No.: US 7,553,703 B2
(45) Date of Patent: Jun. 30, 2009

(54) METHODS OF FORMING AN INTERCONNECT STRUCTURE

(75) Inventors: Klaus Herold, Fishkill, NY (US); Erdem Kaltalioglu, Newburgh, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/014,539

(22) Filed: Jan. 15, 2008

(65) Prior Publication Data

US 2008/0119039 A1 May 22, 2008

Related U.S. Application Data

(62) Division of application No. 11/105,879, filed on Apr. 14, 2005, now Pat. No. 7,332,812.

(51) Int. Cl.
*H01L 21/82* (2006.01)
*H01L 23/48* (2006.01)

(52) U.S. Cl. .................. 438/129; 438/622; 257/758; 257/774; 257/776; 257/E23.143; 257/E23.145

(58) Field of Classification Search .................. None
See application file for complete search history.

(56) References Cited

U.S. PATENT DOCUMENTS

| | | | | |
|---|---|---|---|---|
| 5,506,450 A | * | 4/1996 | Lee et al. | 257/767 |
| 5,620,916 A | | 4/1997 | Eden et al. | |
| 6,097,094 A | * | 8/2000 | Ishigami | 257/763 |
| 6,753,611 B1 | * | 6/2004 | Maeno et al. | 257/774 |
| 6,826,742 B2 | | 11/2004 | Maeno et al. | |
| 7,245,019 B2 | | 7/2007 | Murata et al. | |
| 7,332,812 B2 | * | 2/2008 | Herold et al. | 257/758 |
| 2004/0056280 A1 | * | 3/2004 | Murata et al. | 257/208 |
| 2005/0179134 A1 | * | 8/2005 | Matsubara | 257/758 |

* cited by examiner

*Primary Examiner*—Alonzo Chambliss
(74) *Attorney, Agent, or Firm*—Slater & Matsil, L.L.P.

(57) ABSTRACT

Semiconductor devices having conductive lines with extended ends and methods of extending conductive line ends by a variable distance are disclosed. An end of a first conductive feature of an interconnect structure is extended by a first distance, and an end of a second conductive feature of the interconnect structure is extended by a second distance, the second distance being different than the first distance. Ends of conductive features that are positioned close to adjacent conductive features are preferably not extended.

18 Claims, 4 Drawing Sheets

US 7,553,703 B2

METHODS OF FORMING AN INTERCONNECT STRUCTURE

This is a divisional application of U.S. application Ser. No. 11/105,879, which was filed on Apr. 14, 2005, and issued as U.S. Pat. No. 7,332,812 on Feb. 19, 2008, and is incorporated herein by reference.

TECHNICAL FIELD

The present invention relates generally to the fabrication of semiconductor devices, and more particularly to the design and fabrication of conductive features of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon, forming integrated circuits.

Many integrated circuits include a plurality of transistors and other devices formed within and over a substrate, as shown in a cross-sectional view in FIG. 1. The semiconductor device 100 shown includes a workpiece or substrate 102 and transistors 106 that include a gate 108 and source and drain regions 104 formed within the substrate 102. The transistors 106 and other devices (not shown) may be electrically connected together or to other devices using metallization layers M1, V1, and M2. There may be one or more metallization layers M1, V1, M2 disposed over transistors 106 and other devices formed in a workpiece 102, for example, as shown.

An insulating material layer 110a may be disposed between the transistors 106. Conductive features 116a may comprise plugs or vias that make electrical contact to a source or drain region 104 of a transistor 106, for example. Metallization layer M1 includes a plurality of conductive features 112a formed within an insulating material layer 110b disposed over insulating material layer 110a. Some of the conductive features 112a may comprise conductive lines that make electrical contact to the gates or gate contacts of the transistors 106, as shown. Other conductive features 112a may comprise plugs or vias that electrically connect conductive features 116a and 116b, as shown. Metallization layer V1 may include a plurality of vias 116b formed in an insulating material layer 110c that provide electrical connection between conductive features 112a and 112b in adjacent metallization layers M1 and M2, for example. Metallization layer M2 may include conductive features 112b that comprise conductive lines formed in an insulating material layer 110d, for example.

A top view of metallization layer M1 is shown in FIG. 2. Conductive features 112a comprise a plurality of conductive lines that have ends that reside over gate contacts 108, as shown. In some semiconductor device 100 designs, the conductive line ends make contact with two underlying contacts 108, as shown.

There is a trend in the semiconductor industry towards reducing the size of features, e.g., the circuits, elements, and conductive lines and vias, in order to increase performance of the semiconductor devices, for example. The minimum feature size of semiconductor devices has steadily decreased over time. As feature sizes diminish, patterning and alignment of conductive lines and circuit components becomes challenging.

One problem that can occur is line end shortening 116, which is shown in the cross-sectional view of FIG. 1. Variations in wafer processing may cause shortening 116 of line ends of conductive features 112b, e.g., a line end may be shortened to 114 by an amount 116, reducing the amount of overlap of conductive features 112b with an underlying vias 116b or contact (e.g., such as gate contacts 108). If the amount of line end shortening is large, there may be no overlap to an underlying via 116b or contact 108, resulting in open circuits and reduced manufacturing yields.

One possible approach to solving the line end shortening problem may be to increase the amount of overlap of conductive features to underlying vias or contacts. However, this approach has the drawback of increasing the overall size of the integrated circuit, e.g., in a lateral direction.

Another approach may be to develop more complex lithography techniques (e.g., such as the use of serifs and other lithography improvement techniques) and/or etch solutions to prevent line end shortening, for example. However, these solutions have been tried in the industry and have not been shown to adequately solve the line end shortening problem.

What are needed in the art are methods for reducing line end shortening of conductive features of semiconductor devices.

SUMMARY OF THE INVENTION

These and other problems are generally solved or circumvented, and technical advantages are generally achieved, by preferred embodiments of the present invention, which provide novel methods of systematically extending the ends of conductive lines by a variable amount, depending on the proximity of a particular conductive line end to adjacent conductive lines in the same conductive line layer.

In accordance with a preferred embodiment of the present invention, a semiconductor device includes a workpiece having a first circuit element and a second circuit element formed thereon, the first circuit element comprising a first contact region and the second circuit element comprising a second contact region. A first conductive feature is disposed proximate the first circuit element. The first conductive feature includes an end that is disposed over and makes electrical contact to the first contact region of the first circuit element. The end of the first conductive feature extends from the first conductive feature past the first contact region of the first circuit element by a first distance. A second conductive feature is disposed proximate the second circuit element. The second conductive feature includes an end that is disposed over and makes electrical contact to the second contact region of the second circuit element. The end of the second conductive feature extends from the second conductive feature past the second contact region of the second circuit element by a second distance, the second distance being different than the first distance.

In accordance with another preferred embodiment of the present invention, a method of manufacturing a semiconductor device includes providing a workpiece, and forming a plurality of circuit elements within or over the workpiece. The plurality of circuit elements comprises a first contact region and a second contact region. An interconnect structure is formed over the plurality of circuit elements. The interconnect structure comprises a first conductive feature and a second conductive feature. The first conductive feature is disposed over and makes electrical contact to the first contact region. The second conductive feature is disposed over and makes electrical contact to the second contact region. An end of the first conductive feature extends beyond the first contact region by a first distance. An end of the second conductive feature extends beyond the second contact region by a second distance, the second distance being different than the first distance.

In accordance with yet another preferred embodiment of the present invention, a method of designing a semiconductor device includes designing a plurality of circuit elements, and designing an interconnect structure to be disposed over the plurality of circuit elements and provide electrical connection to the plurality of circuit elements. The interconnect structure comprises a plurality of conductive features, each of the plurality of conductive features having at least one end. The method includes extending the at least one end of a first conductive feature of the interconnect structure by a first distance, and extending the at least one end of a second conductive feature of the interconnect structure by a second distance, the second distance being different than the first distance.

Advantages of preferred embodiments of the present invention include increasing the overlay margin of conductive lines to underlying contacts, vias or circuit elements, resulting in increased yields. The ends of conductive lines are only extended where space is available in the layout of a particular conductive line layer, so that the amount of horizontal space is not increased, and the footprint of the integrated circuit remains the same. One or more conductive line layers may be enhanced by selectively extending the conductive line ends, in accordance with embodiments of the present invention, for example.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having a plurality of interconnect layers that make electrical contact to gates, source and drain regions of transistors, and to vias or contacts. The invention may also be applied, however, to semiconductor devices having other types of circuit elements, such as resistors, diodes, capacitors, memory devices, and/or other electronic elements, as examples.

Embodiments of the present invention achieve technical advantages by extending the ends of conductive lines of interconnect structures by variable amounts, depending on the amount of space available near the ends of the conductive lines within the conductive line layer. If no space is available to extend the conductive line ends, the ends are not extended. If a large amount of space is available, then the conductive line ends are extended by a predetermined amount, e.g., up to a predetermined percentage of the width of the conductive lines, in one embodiment, as an example. If a medium amount of space is available for extending the conductive line ends, then the ends are extended by a distance that increases the overlap margin to an underlying contact region or circuit element, yet the ends are preferably not extended by an excessive amount, to avoid causing shorting to adjacent conductive lines within the conductive line layer, for example.

Figure 1:
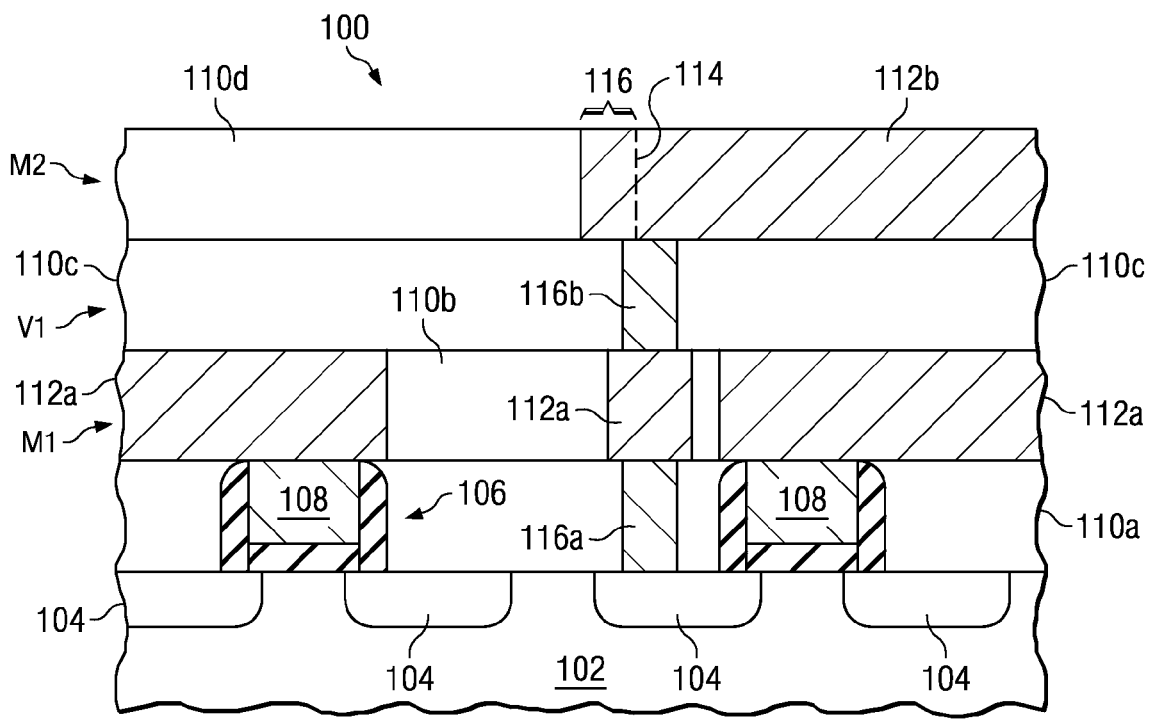
FIG. 1 is a cross-sectional view of a prior art semiconductor device having a multi-layer interconnect system that exhibits line end shortening.
Figure 2:
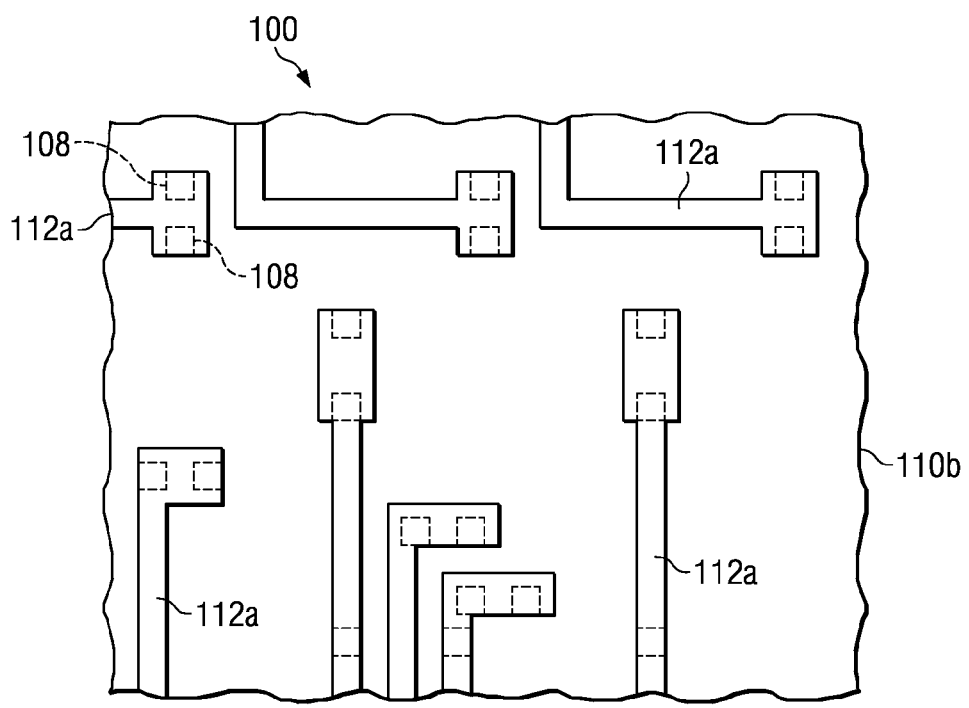
FIG. 2 is a top view of a portion of the semiconductor device of FIG. 1.
Figure 3:
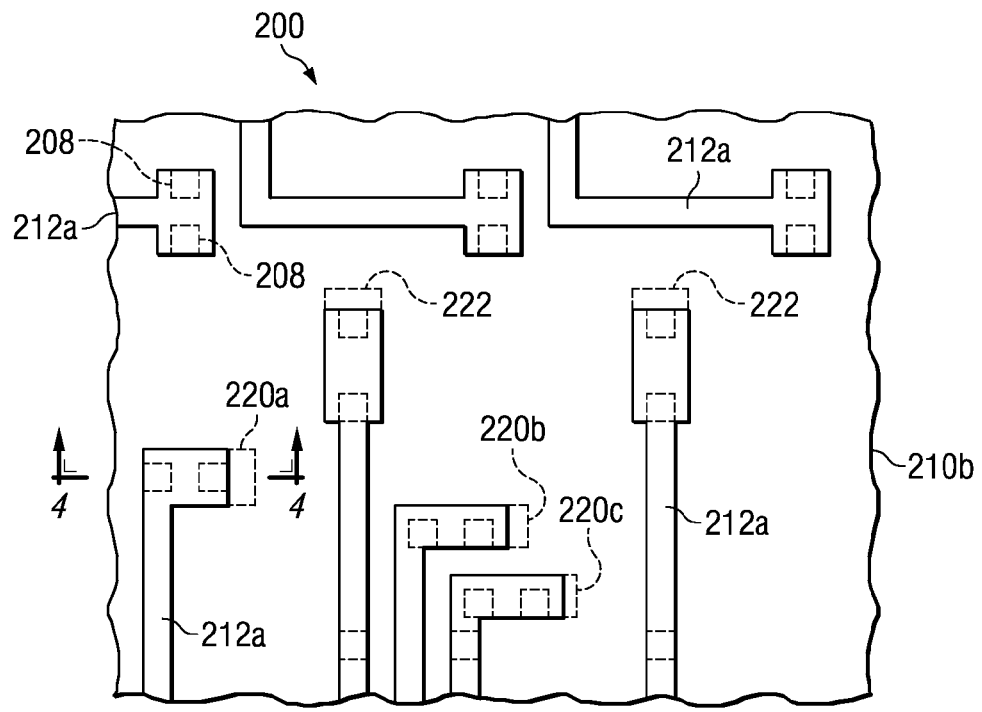
FIG. 3 is a top view of a preferred embodiment of the present invention, wherein the ends of conductive lines are extended by variable amounts.
Figure 4:
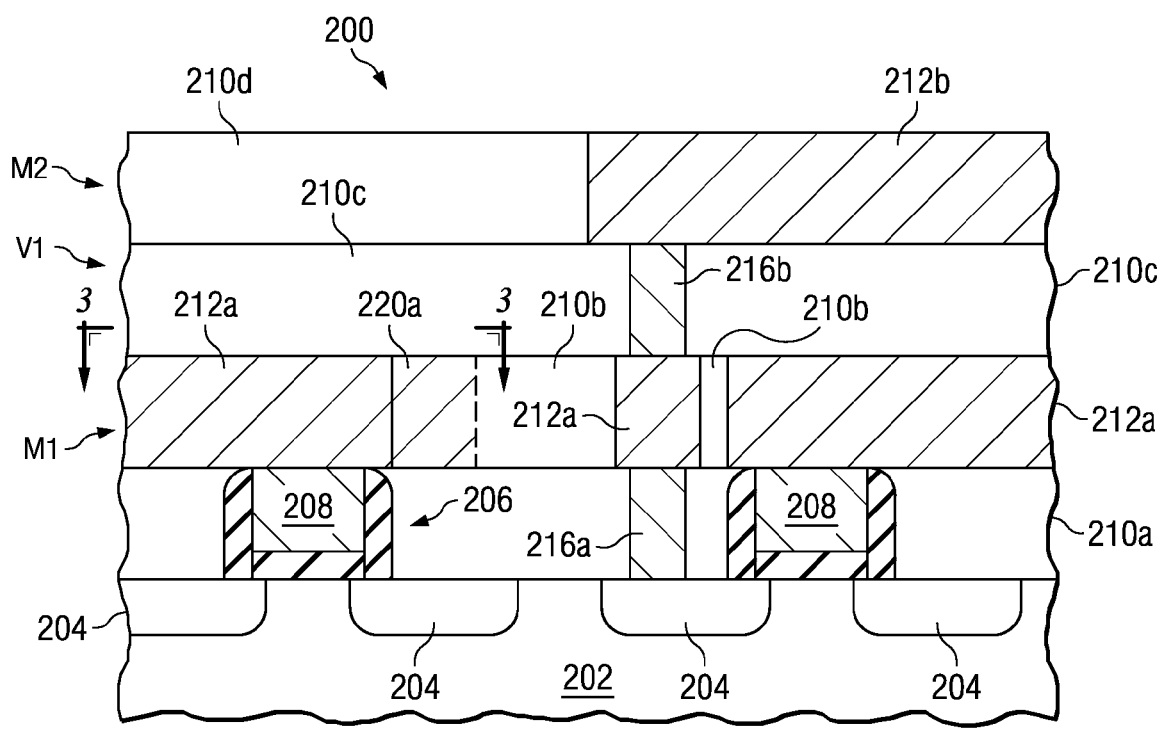
FIG. 4 is a cross-sectional view of a preferred embodiment of the present invention.

With reference now to FIGS. 3 and 4, a cross-sectional view of a preferred embodiment of the present invention is shown in FIG. 4, and a top view of metallization layer M1 of FIG. 4 is shown in FIG. 3. Like numerals are used in FIGS. 4 and 3 as were used in prior art FIGS. 1 and 2.

In the top view shown in FIG. 3, variable extension of conductive lines in accordance with an embodiment of the present invention is demonstrated. For example, at 220a, a conductive line 212a is extended by a maximum amount 220a. The conductive line 212a extended by amount 220a is spaced relatively far away from other conductive lines 212a in the same conductive line layer; therefore, in accordance with an embodiment of the present invention, the end of the conductive line 212a is extended by a predetermined maximum value, e.g., by an amount equal to about 50 to 70% or less of the width of a conductive line 212a, as shown, in one embodiment. Alternatively, the end of the conductive line 212a may be extended by an amount equal to about 70% or greater of the width of a conductive line 212a, for example. The conductive line end is extended in the x direction at 220a, for example.

At 220b, the conductive line 212a having an end that is extended is closer to an adjacent conductive line 212a within the metallization layer (e.g., M1; see FIG. 4); therefore, preferably the conductive line 212a is extended by an amount 220b that is less than amount 220a, for example. At 220c, the conductive line 212a having an end that is extended is even closer to an adjacent conductive line 212a; therefore, the conductive line 212a is extended by an amount 220c that is less than amounts 220b and 220a, for example.

Other ends of conductive lines 212 may not be extended, in one embodiment. For example, the conductive line 212a ends in the top of FIG. 3 are preferably not extended at all. Shown at 222, the conductive line 212a ends may be extended in the y direction, as well as in the x direction, as shown at 220a, 220b, and 220c.

Referring to FIG. 4, to manufacture a semiconductor device 200 in accordance with an embodiment of the present invention, first, a workpiece 202 is provided. The workpiece 202 may include a semiconductor substrate comprising silicon or other semiconductor materials covered by an insulating material layer, for example. The workpiece 202 preferably includes active areas comprising electrical components and/or circuits formed over and/or within the workpiece 202. The workpiece 202 may comprise silicon oxide over single-crystal silicon, for example. The workpiece 202 may include transistors 206 and other conductive layers or other semiconductor elements, e.g., diodes, capacitors, resistors, etc., not shown. Compound semiconductors, GaAs, InP, Si/Ge, or SiC, as examples, may be used in place of silicon. The workpiece 202 may also comprise a silicon-on-insulator (SOI) substrate, for example.

In one embodiment, the workpiece 202 preferably comprises a first circuit element and a second circuit element formed thereon, the first circuit element comprising a first contact region, and the second circuit element comprising a second contact region. For example, a circuit element may include a transistor 206, or a circuit element may include a via 216a or 216b or conductive line 212a or 212b, for example. The contact regions comprise the region in which an overlying conductive feature makes electrical contact with the circuit element, for example. The contact regions may comprise the gate 208 or gate contact of the transistor, vias 216a or 216b, or conductive lines 212a or 212b, as examples.

Preferably, a first conductive feature (such as conductive line 212a in metallization layer M1) is formed proximate the first circuit element (such as transistor 206). The first conductive feature 212a includes an end that is disposed over and makes electrical contact to the first contact region (e.g., gate 208) of the first circuit element 206. The end of the first conductive feature 212a preferably extends from the first conductive feature past the first contact region of the first circuit element by a first distance, such as distance 220a in FIG. 3.

A second conductive feature (such as another conductive line 212a in metallization layer M1) is disposed proximate the second circuit element (such as another transistor 206 or a via 216a), the second conductive feature 212a including an end that is disposed over and makes electrical contact to the second contact region (such as a gate 208 or a via 216a) of the second circuit element. The end of the second conductive feature 212a preferably extends from the second conductive feature past the second contact region of the second circuit element by a second distance such as distance 220c shown in FIG. 3, the second distance 220c being different than the first distance 220a.

Preferably, the ends of a plurality of conductive features 212a are extended by variable amounts, in accordance with embodiments of the present invention. For example, there may be hundreds and thousands of conductive lines formed in a single integrated circuit die, with each of the conductive lines having ends that are extended by variable amounts (not shown). Some conductive lines may not have their ends extended at all; e.g., they may be extended by a distance of zero in some locations within a conductive line layer.

One or more conductive line layers may have the variable end extensions described herein implemented therein, in accordance with embodiments of the present invention. The variable conductive line end extensions have useful application in semiconductor devices with a single layer of interconnect, or multiple layers of interconnect, as examples.

The conductive features 212a and 212b with extended line ends may be formed in a metallization layer M1 or M2 of a semiconductor device 200, and may comprise an insulating material layer 210b or 210d disposed between the conductive features 212a and 212b, as shown in FIG. 4, for example. The conductive features 212a and 212b may include a liner and/or a seed layer, not shown. The conductive features 212a and 212b may comprise aluminum, copper, or combinations or alloys thereof, although alternatively, the conductive features 212a and 212b may comprise other conductive materials. The conductive features 212a and 212b may comprise semiconductive materials such as polysilicon or other forms of silicon, or combinations of semiconductive materials with metals, as examples. The conductive features 212a and 212b may be formed using a damascene process or using a subtractive etch process, as examples.

The insulating material layers 210a, 210b, 210c, or 210d may comprise silicon dioxide, silicon nitride, combinations thereof, or low-dielectric constant materials having a dielectric constant less than the dielectric constant of silicon dioxide, or combinations with silicon dioxide and/or silicon nitride, for example. The vias 216a and 216b may comprise tungsten, aluminum, copper, other metals, liners, seed layers, and/or combinations thereof, as examples, although alternatively, other materials may be used.

The amount the ends of the conductive features 212a and 212b are extended is preferably variable from conductive feature to conductive feature, and is preferably a function of a distance from the end of a particular conductive feature to an adjacent conductive feature in the conductive feature layer, in one embodiment. In particular, in one embodiment, the conductive features may comprise a minimum line width, and the maximum distance that ends of the conductive features are extended preferably comprises about a predetermined percentage or less the minimum line width. The maximum distance the ends of the conductive features are extended may alternatively be a function of other parameters of the semiconductor advise, for example.

Embodiments of the present invention include semiconductor devices having conductive features with variably extended line ends described herein. Embodiments of the present invention also include methods of manufacturing the novel semiconductor devices described herein. Methods of designing semiconductor devices are also included.

For example, in accordance with an embodiment of the present invention, a method of designing a semiconductor device includes designing a plurality of circuit elements, and designing an interconnect structure to be disposed over the plurality of circuit elements and provide electrical connection to the plurality of circuit elements. The interconnect structure comprises a plurality of conductive features, each of the plurality of conductive features having at least one end. The at least one end of a first conductive feature of the interconnect structure is extended by a first distance, and at least one end of a second conductive feature of the interconnect structure is extended by a second distance, the second distance being different than the first distance. Preferably, the design for the interconnect structure is adjusted using optical proximity correction (OPC) after extending the ends of the conductive features, in this embodiment, for example. A plurality of mask sets is then developed for the semiconductor device, and the semiconductor device is manufactured on a workpiece using the plurality of mask sets.

Figure 5:
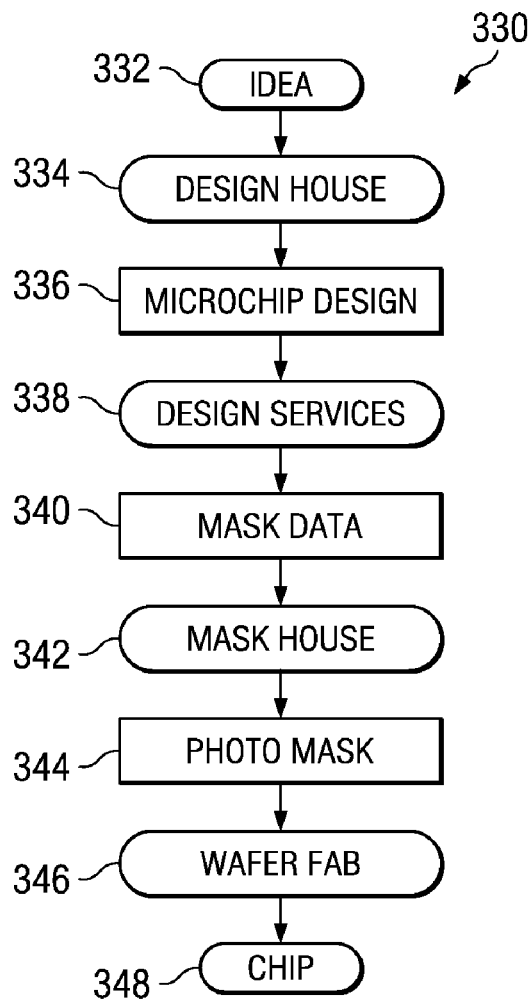
FIG. 5 is a flow chart of a process of designing and manufacturing a semiconductor device.

FIG. 5 is a flow chart 330 of a process of designing and manufacturing a semiconductor device, illustrating the roles of various semiconductor companies and organizations during the various processes. First, an idea is developed for a semiconductor device (step 332). For example, a customer may have an end application that a particular integrated circuit is needed to perform in. The idea is presented to a design house (step 334). The design house develops a microchip design (step 336), which is then communicated to a design services group (step 338). Design services generates mask data (step 340), and the mask data is sent to a mask house (step 342). The mask house fabricates the photo masks (step 344) that may be used to pattern the various material layers of a semiconductor device using lithography. The photo masks are sent to a wafer fabrication facility (step 346), which then manufactures the integrated circuits or chips (step 348). The roles of the design house, design services, mask house, and wafer fab may be performed by different companies, or a company may be partially or completely vertically integrated and have the capability of performing one or more roles described in the flow chart 330, for example.

Figure 6:
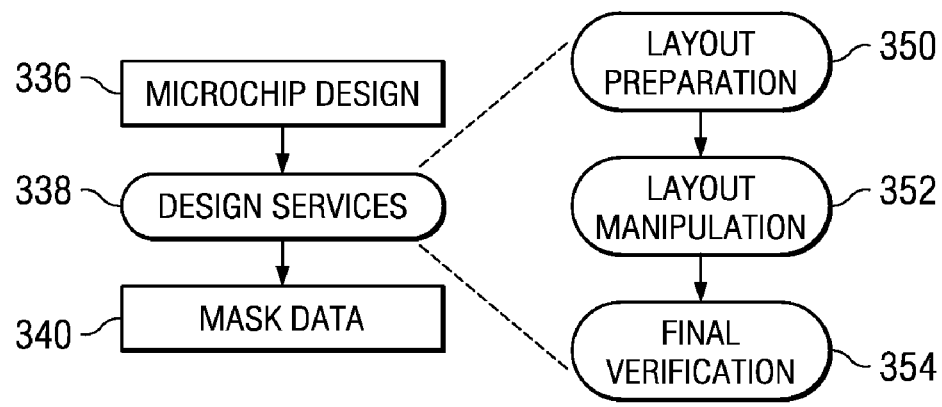
FIG. 6 is a more detailed flow chart of a portion of the flow chart shown in FIG. 5.

FIG. 6 is a more detailed flow chart of a portion of the flow chart shown in FIG. 5. The design services group is responsible for layout preparation (step 350), manipulation of the layout (step 352), which may include OPC and other adjustments to ensure that a desired pattern is actually generated on a material layer, and final verification (step 354), as examples.

Figure 7:
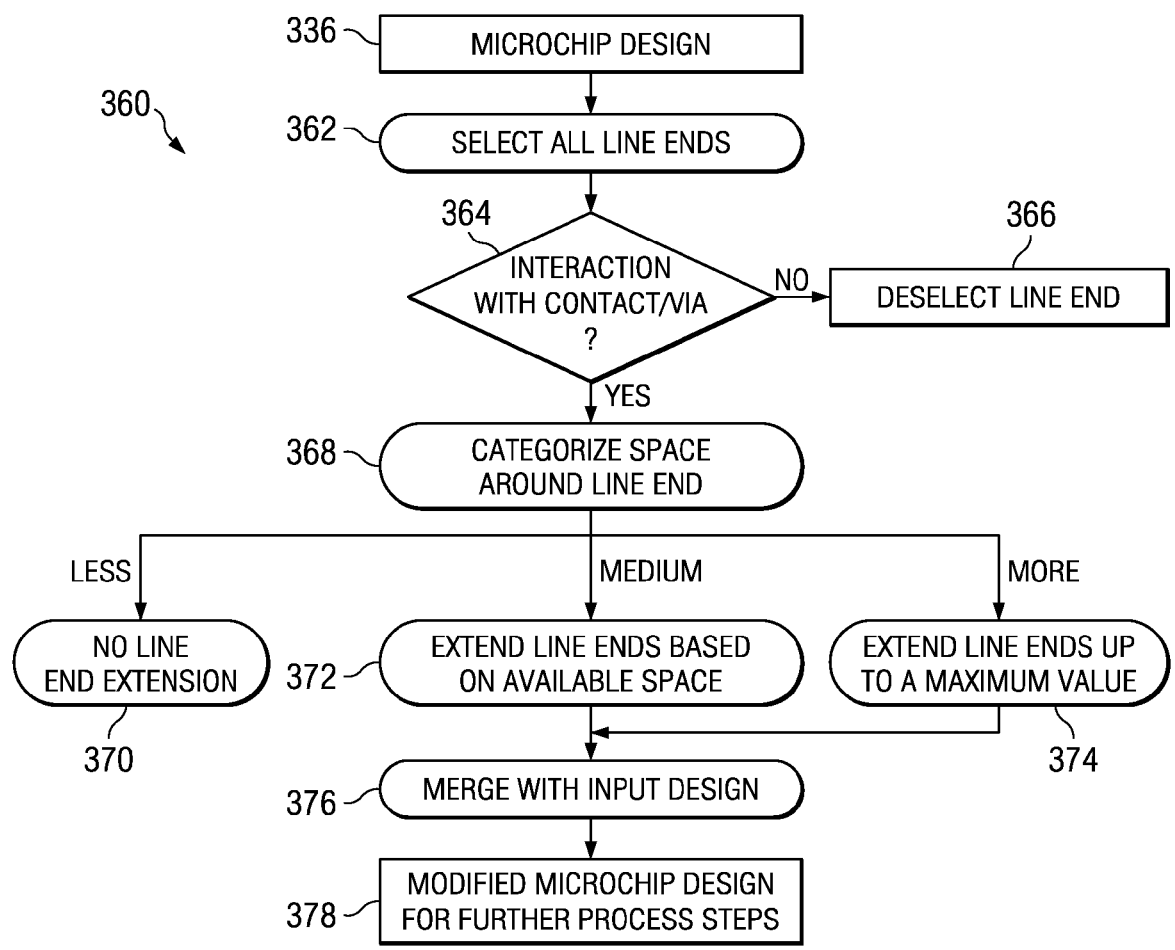
FIG. 7 is a flow chart illustrating a method of extending conductive line ends in accordance with a preferred embodiment of the present invention.

FIG. 7 is a flow chart 360 illustrating a method of extending conductive line ends in accordance with a preferred embodiment of the present invention. After the microchip is designed (step 336), the ends of all of the conductive lines in the design are selected (step 362), e.g., by locating the ends of the lines in the software for the conductive line layer pattern. Each line end is analyzed to determine if there is an interaction (e.g., electrical contact will be made) with a contact region or via in an underlying conductive feature layer (step 364). If there is no interaction with a contact region or via, the end of that particular conductive line is deselected (step 366). If there is interaction with a contact region or via, then the space around the end of the conductive line is categorized (step 368).

For example, the categorization may be divided into three classifications of conductive line ends: less, medium and more, (with the amounts referring to the amount of space between adjacent conductive features) as shown in the flow chart 360 of FIG. 7. Alternatively, several categories, e.g., 4 to 10 or greater may be used to categorize the conductive line ends as a function of the space around the line ends; in particular, the distance from the line ends to adjacent conductive lines or features.

If three categories are used, then if there is less space between an end of a conductive line and an adjacent conductive feature, then there is no line end extension (step 370). For example, the amount of space between an end of a conductive line and an adjacent conductive feature may be equal to or close to the amount of a minimum feature size of the semiconductor device. In this case, preferably, the end of the conductive line is not extended at all.

If there is a medium amount of space between an end of a conductive line and an adjacent conductive feature, then the end of the conductive line is extended based on the available space (step 372). For example, the end of the conductive line may be extended by an amount about equal to the minimum feature size of the semiconductor device or less. As another example, the medium amount of space in this embodiment may be about equal to the predetermined maximum value of the line end extension less the minimum feature size (e.g., the width of a conductive line).

If there is a large amount or more space between an end of a conductive line and an adjacent conductive feature, then the end of the conductive line is preferably extended up to a maximum value (step 374). For example, the maximum value may be set as a percentage of a minimum feature size or minimum line width, e.g., a predetermined percentage or less of the chosen standard measurement or other percentage.

The design of the conductive line layer is then adjusted, e.g., after the algorithm is used to extend the ends of the conductive line patterns by variable amounts, then the adjustments are merged with the input design (step 376). The microchip design may then be modified for further processing steps (step 378), such as fill generation and/or OPC, as examples.

An example of computer code that may be used to perform the algorithm is shown below. This exemplary code is written in Calibre, a software program provided by Mentor Graphics. Alternatively, other software programs may be used, e.g., that are typically used to perform design rule verification for semiconductor devices.

Exemplary code for algorithm:

```
1 // Select Line Ends
2 // -----------------------------------------------------------------
3 All_LineEnds = CONVEX EDGE Metal ANGLE1 < 180 LENGTH1 >= LineEndAdjacent
ANGLE 2 < 180 LENGTH2 >= LineEndAdjacent WITH LENGTH <= LineWidth
4
5 // Interacting with Contact / Via
6 //-----------------------------------------------------------------
7 ContactVia_Marker      = OR (SIZE Contact BY SizeContact) (SIZE Via BY SizeVia)
8 Critical_LineEnd       = TOUCH EDGE All_LineEnds (INTERACT (EXPAND EDGE
All_LineEnds INSIDE BY 0.002) ContactVia_Marker)
9
10 // Categorize Space around Line End
11 //-----------------------------------------------------------
12 SpaceCat1              = EXTERNAL [Critical_LineEnd] Metal <= Space1
13 SpaceCat2              = EXTERNAL [Critical_LineEnd] Metal <= Space2
14 SpaceCat3              = EXTERNAL [Critical_LineEnd] Metal <= Space3
15 LineEndCat1                  TOUCH EDGE Critical_LineEnd SpaceCat1
16 LineEndCat2            = NOT TOUCH EDGE (TOUCH EDGE Critical_LineEnd
```

```
   SpaceCat2)            SpaceCat1
17 LineEndCat3            = NOT TOUCH EDGE (TOUCH EDGE Critical_LineEnd
   SpaceCat3)             SpaceCat2
18 LineEndCat4            = NOT TOUCH EDGE Critical_LineEnd          SpaceCat3
19
20 // Extend Line Ends
21 //------------------------------------------------------------
22 LineEndExtension2 = EXPAND EDGE LineEndCat2 OUTSIDE BY Extension2
23 LineEndExtension3 = EXPAND EDGE LineEndCat3 OUTSIDE BY Extension3
24 LineEndExtension4 = EXPAND EDGE LineEndCat4 OUTSIDE BY Extension4
25
26 // Merge with original design
27 //------------------------------------------------------------
28 Modified_Metal         = OR Metal (OR LineEndExtension2) (OR LineEndExtension3
   LineEndExtension4))
```

Advantages of embodiments of the invention include providing novel methods of extending conductive line ends to increase the margin of error for overlapping conductive features, and increase manufacturing yields of semiconductor devices. Embodiments of the invention use a novel algorithm that finds only critical line ends, in respect to other adjacent geometries, such as contact regions and vias, and extends the conductive line ends dependant upon available space in that particular material layer, up to a predetermined limit. Because only features with enough space available for the line end extensions are extended, advantageously, chip size is not increased. The algorithm marks critical line ends in respect to inter-layer geometries and extends them, if possible. The target layer for all further operations, e.g., OPC, is then the adjusted conductive line layer with the variably extended line ends. The modified conductive line layer design is less sensitive in the event of overlay error or process variations in lithography and/or etch processes, as compared to the original design of the conductive line layer, for example.

The extensions of the conductive line ends preferably have different lengths, in accordance with embodiments of the present invention. Because the extensions of the ends of the lines do not reside over electrically active circuits or regions, the effect of the line end extensions on resistance, capacitance, and timing is negligible, for example. The process window of the fabrication of interconnects of semiconductor devices is increased by the use of the novel embodiments of the invention described herein.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   forming a plurality of circuit elements within or over the workpiece, the plurality of circuit elements comprising a first contact region and a second contact region; and
   forming an interconnect structure over the plurality of circuit elements, the interconnect structure comprising a first conductive feature and a second conductive feature, the first conductive feature being disposed over and making electrical contact to the first contact region, the second conductive feature being disposed over and making electrical contact to the second contact region, wherein an end of the first conductive feature extends beyond the first contact region by a first distance, and wherein an end of the second conductive feature extends beyond the second contact region by a second distance, the second distance being different than the first distance.

2. The method according to claim 1, wherein the first distance and the second distance are a function of a distance of the end of the first conductive feature and the end of the second conductive feature, respectively, from an adjacent conductive feature in the interconnect structure.

3. The method according to claim 1, wherein the plurality of circuit elements comprise conductive vias or active circuit elements in an underlying material layer.

4. The method according to claim 1, wherein the first conductive feature and the second conductive feature comprise a metal material.

5. The method according to claim 1, wherein the first conductive feature and the second conductive feature comprise a semiconductive material.

6. The method according to claim 1, wherein the first distance or the second distance comprises zero.

7. A method of designing a semiconductor device, the method comprising:
   designing a plurality of circuit elements;
   designing an interconnect structure to be disposed over the plurality of circuit elements and provide electrical connection to the plurality of circuit elements, the interconnect structure comprising a plurality of conductive features, each of the plurality of conductive features having at least one end;

extending the at least one end of a first conductive feature of the interconnect structure by a first distance from a first electrical connection of a first circuit element; and extending the at least one end of a second conductive feature of the interconnect structure by a second distance from a second electrical connection of a second circuit element, the second distance being different than the first distance.

8. The method according to claim 7, wherein the first distance is a function of a distance between the first conductive feature and an adjacent conductive feature, and wherein the second distance is a function of a distance between the second conductive feature and an adjacent conductive feature.

9. The method according to claim 7, wherein the first distance or the second distance is zero.

10. The method according to claim 7, wherein each of the plurality of circuit elements comprises at least one contact region, wherein the conductive features make electrical contact to the contact regions of the plurality of circuit elements.

11. The method according to claim 7, wherein the plurality of conductive features comprises a minimum line width, wherein the first distance or the second distance comprises about a predetermined percentage of the minimum line width or less.

12. The method according to claim 7, further comprising performing optical proximity correction (OPC) on the interconnect structure design, after extending the at least one end of the second conductive feature.

13. The method according to claim 7, further comprising developing a plurality of mask sets for the semiconductor device, and manufacturing a semiconductor device on a workpiece using the plurality of mask sets.

14. The method according to claim 7, further comprising;

analyzing each of the plurality of conductive features of the interconnect structure design to determine which of the plurality of conductive features will make electrical connection to an underlying circuit element; and deselecting the plurality of conductive features that will not make electrical connection to an underlying circuit element.

15. The method according to claim 14, further comprising, after deselecting the plurality of conductive features:

categorizing an amount of available space around the at least one end of each of the plurality of conductive features; and determining the amount to extend the at least one end of each of the plurality of conductive features based on the amount of available space around the at least one end of each of the plurality of conductive features.

16. The method according to claim 15, wherein determining the amount to extend the at least one end of each of the plurality of conductive features comprises:

if there is a lesser amount of available space around the at least one end of each of the plurality of conductive features, the amount to extend the at least one end of each of the plurality of conductive features is zero;

if there is a medium amount of available space around the at least one end of each of the plurality of conductive features, the amount to extend the at least one end of each of the plurality of conductive features is determined based on the amount of available space; and if there is a large amount of available space around the at least one end of each of the plurality of conductive features, the amount to extend the at least one end of each of the plurality of conductive features is equal to a predetermined maximum value.

17. The method according to claim 16, wherein each of the plurality of conductive features of the interconnect structure comprises a width comprising a minimum feature size, wherein the less amount of available space comprises about the minimum feature size, and wherein the medium amount of space is about equal to the predetermined maximum value less the minimum feature size.

18. The method according to claim 17, wherein the predetermined maximum value comprises about a predetermined percentage of the minimum feature size or less.

* * * * *